United States Patent [19]

Fisher et al.

[11] 3,951,693

[45] Apr. 20, 1976

[54] ION-IMPLANTED SELF-ALIGNED TRANSISTOR DEVICE INCLUDING THE FABRICATION METHOD THEREFOR

[75] Inventors: John A. Fisher, Mesa, Ariz.; Demir S. Zoroglu, Palm Beach Gardens, Fla.

[73] Assignee: Motorola, Inc., Chicago, Ill.

[22] Filed: Jan. 17, 1974

[21] Appl. No.: 434,177

[52] U.S. Cl. .................................. 148/1.5; 148/187; 357/91
[51] Int. Cl.² .................................... H01L 21/265
[58] Field of Search ........................... 148/1.5, 187

[56] References Cited
UNITED STATES PATENTS

| | | | |
|---|---|---|---|
| 3,660,735 | 5/1972 | McDougall | 148/1.5 X |
| 3,681,153 | 8/1972 | Clark et al. | 148/187 |
| 3,725,150 | 4/1973 | George | 148/187 |
| 3,771,218 | 11/1973 | Langdon | 148/187 |
| 3,783,047 | 1/1974 | Paffen et al. | 148/187 |
| 3,793,090 | 2/1974 | Barile et al. | 148/1.5 |

*Primary Examiner*—L. Dewayne Rutledge
*Assistant Examiner*—J. M. Davis
*Attorney, Agent, or Firm*—Lowell E. Clark; Harry M. Weiss

[57] ABSTRACT

This disclosure is directed to an ion-implanted self-aligned transistor device including the fabrication method therefor wherein the emitter region and a pair of heavily doped base contact regions are spaced in a self-aligned manner from the periphery of the emitter region in order to precisely align the base contact regions at a predetermined distance from the periphery of the emitter region. Silicon nitride and silicon dioxide insulating layers are used together with an undercutting etching operation to precisely align the pair of spaced heavily doped base contact regions with respect to the periphery of the emitter region. The final completed semiconductor structure utilizes a single base metal contact electrode which makes contact to all of the spaced heavily doped base contact regions. A single emitter metal contact electrode is provided to the emitter regions located outside the periphery of the inner spaced heavily doped base contact regions.

10 Claims, 2 Drawing Figures

ION-IMPLANTED SELF-ALIGNED TRANSISTOR DEVICE INCLUDING THE FABRICATION METHOD THEREFOR

BACKGROUND OF THE INVENTION

1. Field of the Invention

This invention relates generally to self-aligned transistor devices including fabrication methods therefor and, more particularly, relates to ion implanted self-aligned transistor structures including fabrication methods therefor wherein a pair of spaced heavily doped base contact regions are aligned with respect to the periphery of an intermediate emitter region.

2. Background of the Prior Art

Various self-aligned transistor structures and methods for the fabrication thereof have been proposed in the past. Many different techniques have been used to fabricate transistor structures that would be able to provide reliable devices having a high yield in manufacture. However, in the fabrication of high density, multi-emitter contact, multi-base contact semiconductor structures having a single collector contact wherein the structures are particularly suitable for use in microwave area, the techniques used in the past were not of any benefit to devise a method which would result in producing a high yield, repeatable self-aligned transistor structure.

Accordingly, a need existed to develop a self-aligned transistor structure including a method therefor which would overcome the problems of prior art structures and methods to produce a high yield, low cost semiconductor device.

SUMMARY OF THE INVENTION

It is an object of this invention to provide an improved semiconductor structure having self-aligned base contact regions precisely spaced from the periphery of the emitter region.

It is a further object of the invention to provide a method for fabricating self-aligned base contact regions precisely spaced from the periphery of the emitter region.

It is a still further object of this invention to provide ion implanted base contact regions precisely spaced from the periphery of the emitter region.

It is still another object of the invention to provide a method for producing ion implanted base contact regions precisely spaced from the periphery of the emitter region.

It is another object of this invention to provide a self-aligned transistor structure including method therefor which utilizes ion implanted base contact regions precisely spaced from the periphery of an ion implanted emitter region.

DESCRIPTION OF THE SPECIFICATION

Figure 1:
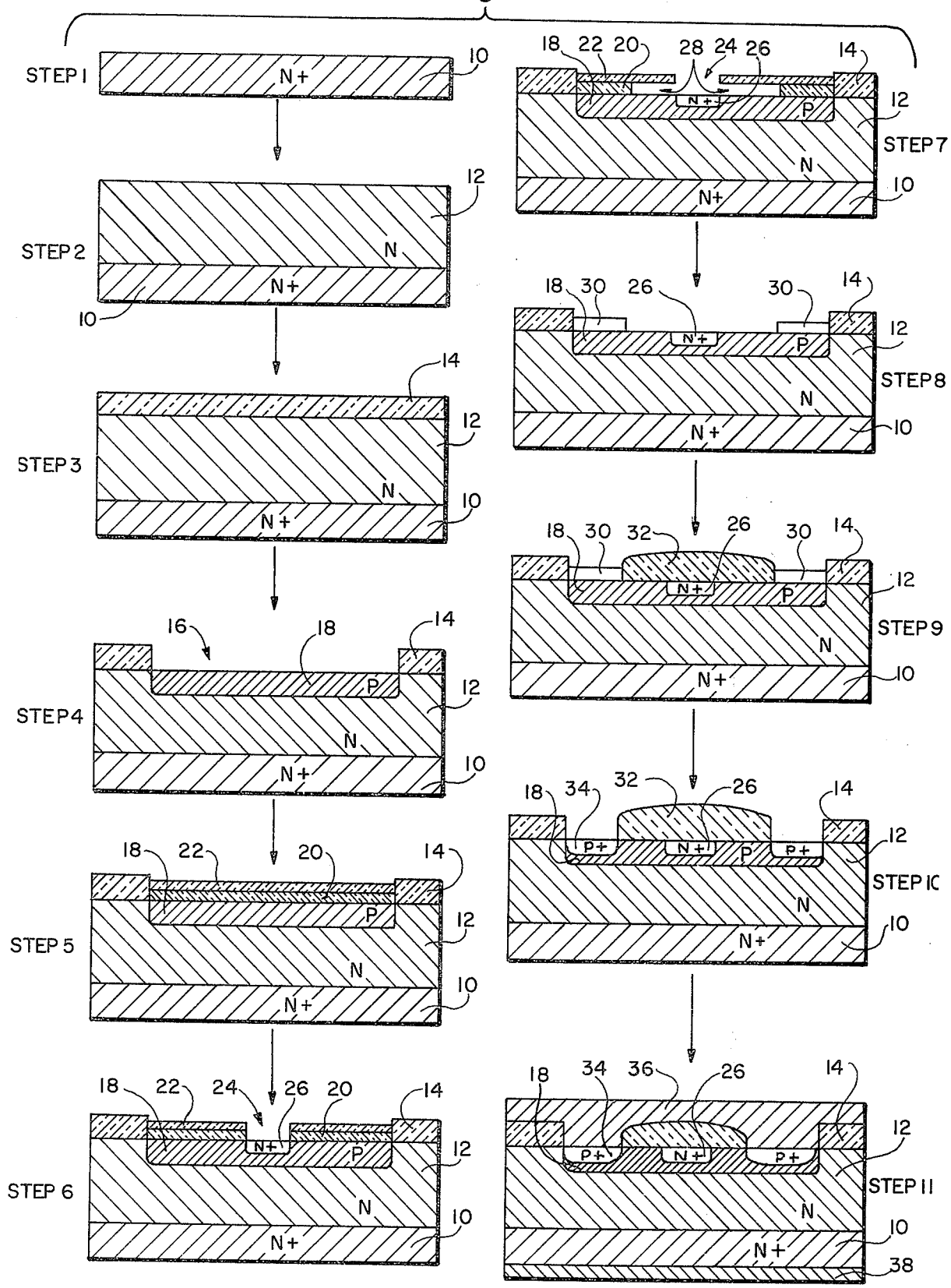
FIG. 1 illustrates elevational cross sectional views of a series of Steps showing the fabrication process for producing a portion of a self-aligned ion implanted semiconductor transistor structure in accordance with the method of this invention.

Referring to FIG. 1, Step 1 illustrates a substrate 10 shown in this example to be of N+ type conductivity. It should be evident to those skilled in the art that the semiconductor regions shown to be of one type conductivity in the drawing can be substituted by semiconductor regions of the opposite conductivity, if desired, in order to produce a PNP transistor structure rather than the NPN transistor structure illustrated in the drawing. For example, the N+ substrate 10 can have a thickness of about 15 mils and an impurity concentration of $10^{21}$ impurities per cubic centimeters of silicon. The impurities can be selected from any N type dopant such as phosphorous, arsenic, etc.

In Step 2, an N type region 12 is epitaxially grown on the N+ substrate 10. Preferably, the N type region 12 has a thickness of about 4 microns and an impurity concentration of approximately $10^{16}$ to $10^{17}$ impurities per cubic centimeters of silicon. Again, the N type dopant used in the epitaxial layer 12 can be either phosphorous, arsenic or some other N type dopant.

In Step 3, a silicon dioxide layer 14 is preferably deposited or grown on the N type layer 12 in order to provide a masking layer for the next processing step. For example, a silicon dioxide layer having a thickness of approximately 5000 Angstroms has been shown to be beneficial for use as the masking layer.

In Step 4, an opening shown generally by reference numeral 16 is formed in the silicon dioxide layer 14 in order to permit the formation of a P type region 18 to be formed within the N type region 12. Either ion implantation or diffusion techniques can be used to form the P type region which have preferably a surface impurity concentration of $10^{18}$ impurities per cubic centimeters of silicon. For example, the P type region 18 would have a depth of one-half micron and could contain a P type dopant such as boron.

In Step 5, first a silicon nitride layer 20 is deposited on the P type region 18 followed by the deposition of the silicon dioxide layer 22 on the silicon nitride layer 20. For example, the layer of silicon nitride 20 can be deposited by pyrolytic or RF sputtering techniques and the silicon dioxide layer 22 can be similarly deposited by pyrolytic or RF sputtering techniques. In the illustrative embodiment, the silicon nitride layer 20 has a thickness of 1000 Angstroms and the silicon dioxide layer 22 also has a thickness of 1000 Angstroms.

In step 6, an opening generally shown by reference numeral 24 is formed by conventional photolithographic masking and etching techniques to achieve etching through a portion of the silicon dioxide layer 22 and the silicon nitride layer 20 using in succession silicon dioxide and silicon nitride etchants. Subsequently, an N+ region 26 is formed in the P type region 18 by means of an ion implantation process at room temperature in order to avoid annealing the silicon nitride layer 20 which would cause hardening thereof and thus not make the silicon nitride layer 20 suitable for the subsequent undercutting etching process shown in Step 7.

Preferably, the ion implantation technique used to form the N+ region 26 makes the region 26 have a depth of about one-quarter micron and also contain an impurity concentration of about $10^{21}$ impurities per cubic centimeters of silicon. Preferably, arsenic or phosphorous impurities are used to form the N+ emitter region 26.

In Step 7, a phosphoric acid is used to preferentially etch a portion of the silicon nitride layer 20 in order to achieve the undercutting configuration shown generally by the arrows associated with reference numeral 28. In this manner, a very precise etching operation can be carried out to carefully control the distance of the annular edge of the remaining silicon nitride layer from the periphery of the N+ region 26. This precise etching or undercutting operation is critical to the subsequent formation of spaced P+ base contact regions in the P type region 18 which are precisely spaced from the periphery of the emitter N+ region 26. It should be understood that the embodiment shown in Step 7 is only one portion of the multi-emitter contact, multi-base contact, transistor structure shown more clearly in FIG. 2.

In Step 8, an oxide etching operation is carried out to preferentially remove only the silicon dioxide layer 22 thereby leaving silicon nitride layer portion 30 which was formed during the undercutting operation shown in Step 7 of FIG. 1.

In step 9, a silicon dioxide layer 32 is formed preferably by thermal growth techniques and covers the opening over the N+ region 26 and the P type region 18 that exists within the opening defined by the remaining portion of the silicon nitride layer 30. Preferably, this silicon dioxide layer 32 has a thickness of about 2000 Angstroms.

In Step 10, the silicon nitride portions 30 are removed by a silicon nitride etchant thereby leaving openings for the subsequent formation of P+ base contact regions 34 in the P type region 18. The P+ base contact regions 34 are a pair of separate, spaced regions and shown more clearly in FIG. 2 to be spaced at a predetermined self-aligned distance from the intermediate emitter region 26. Preferably, the P+ base contact regions 34 have a depth of about one-quarter micron and contain boron impurities having a concentration of about $10^{21}$ impurities per cubic centimeters. Subsequent to the ion implantation step used to form the P+ base contact regions 34, a heat treatment is carried out in a non-oxidizing ambient so that a thermal oxide layer is not formed on the semiconductor surface over the P+ base contact regions 34 in order to permit drive-in of the P type impurities into the P+ regions 34 to reach a desired level, but still leave the surface over the P+ regions 34 free from any insulator or oxide in order to permit the subsequent formation of a good ohmic contact to the P+ base contact regions which is shown in Step 11.

In Step 11, preferably an aluminum metal contact is made to the P+ regions 34 by depositing, for example, a 5000 Angstrom aluminum metal material onto the top surface of the semiconductor structure shown in Step 11. It should be noted that the aluminum makes an excellent low resistance ohmic contact to the spaced P+ base contact regions 34 and does not make ohmic contact to the intermediate N+ emitter region 26 (as shown with respect to FIG. 1) due to the protection thereof by the silicon dioxide layer 32. Subsequently, preferably a gold silicon eutectic metal contact 38 is provided to the backside of the semiconductor structure shown in Step 11 by evaporating gold onto the N+ region 10 and subsequently heat treating the structure to a temperature of about 450°C to form the gold-silicon eutectic metal contact to the collector (N+) substrate region 10.

Figure 2:
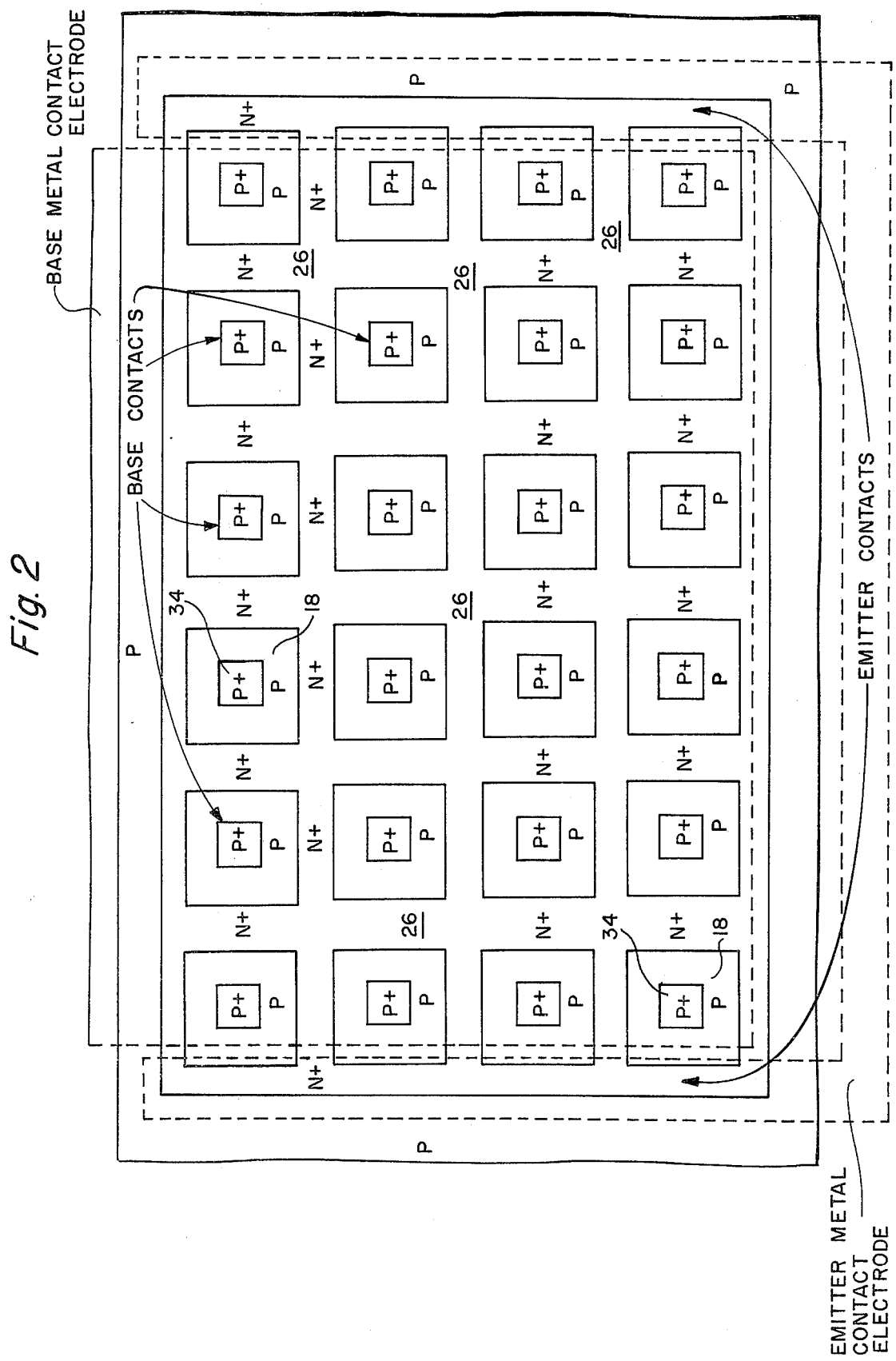
FIG. 2 is a top planar view showing the completed multiemitter contact, multi-base contact, semiconductor transistor structure with common emitter and base metal contacts to the respective emitter and base regions of the semiconductor transistor structure.

Referring to FIG. 2, a base metal contact electrode shown in dotted form is made to all of the P+ base contact regions 34 (in the manner depicted in Step 11) by means of the aluminum metal being in ohmic contact to the P+ base contact regions 34 through the openings in the silicon dioxide insulator (32 or 14) that is located on the surface of the semiconductor structure. The N+ regions 26 are shown to be continuous in the pattern shown in FIG. 2 and protected from contact with the base metal contact electrode by the insulator layer 32 (not shown in this figure).

As a result, the single base metal contact electrode provides a single electrode to all of the multiple base contact regions 34 as part of the self-aligned, fineline geometry structure of this invention. As emitter metal contact electrode is shown in dotted form in this figure and serves to electrically connect to the emitter contact regions which are only located at the periphery of the N+ region 26 shown in dotted form at the left- and right-hand portions of the substantially U-shaped emitter metal contact electrode within which is contained the P+ base contact regions 34. The P region 18 is shown surrounding the P+ spaced base contact regions 34 and the continuous N+ emitter region 26 and is located at the periphery of the transistor structure of FIG. 2. The emitter metal contact electrode only makes ohmic contact to the N+ elongated portions of region 26 through an opening (not shown) in the surface insulating layer.

While the invention has been particularly shown and described in reference to the preferred embodiments thereof, it will be understood by those skilled in the art that changes in form and details may be made therein without departing from the spirit and scope of the invention.

What is claimed is:

1. A method for fabricating a self-aligned transistor device comprising the steps of:
    depositing two different masking layers on the surface of a base region of one type conductivity with one of said two different masking layers in contact with the surface of said base region;
    forming an emitter region of opposite type conductivity in said base region through an initial opening formed in said two different masking layers;
    selectively etching away a portion of said one of said two different masking layers about said initial opening while leaving intact the other of said two different masking layers;
    removing said other of said two different masking layers thereby leaving the remaining portion of said one of said two different masking layers in contact with the surface of said base region;
    forming another masking layer in the opening in said one of said two different masking layers of a different material than the material of said one of said two different masking layers;
    removing the remaining portion of said one of said two different masking layers; and
    forming heavily doped base contact regions in said base region at a predetermined distance from the periphery of said emitter region.

2. The method of claim 1 including the steps of:
    forming said one of two different masking layers of silicon nitride; and
    forming the other of said two different masking layers of silicon dioxide.

3. The method of claim 1 wherein said transistor device being an NPN transistor device.

4. The method of claim 1 including the step of thermally growing a layer of silicon dioxide for said another masking layer.

5. The method of claim 1 including the steps of:
forming said one of said two different masking layers of silicon nitride;
forming the other of said two different masking layers of silicon dioxide; and
thermally growing a layer of silicon dioxide for said another masking layer.

6. The method of claim 5 including the step of etching away the remaining portion of said silicon nitride masking layer.

7. The method of claim 5 including the step of ion implanting impurities to form said base contact regions.

8. The method of claim 7 including the step of ion implanting impurities to form said emitter region.

9. The method of claim 1 including the step of ion implanting impurities to form said base contact regions.

10. The method of claim 9 including the step of ion implanting impurities to form said emitter region.

* * * * *